(12) United States Patent
Rose et al.

(10) Patent No.: US 6,815,952 B1
(45) Date of Patent: Nov. 9, 2004

(54) MAGNETIC RESONANCE DIFFUSION IMAGING WITH EDDY-CURRENT COMPENSATION

(75) Inventors: Stephen Edward Rose, Bunya Queensland (AU); Mark Philip Griffin, Corinda (AU); Katie Louise McMahon, Indooroopilly (AU)

(73) Assignee: The University of Queensland, St. Lucia (AU)

( * ) Notice: Subject to any disclaimer, the term of this patent is extended or adjusted under 35 U.S.C. 154(b) by 10 days.

(21) Appl. No.: 10/435,251

(22) Filed: May 12, 2003

(51) Int. Cl.[7] ................................................. G01V 3/00
(52) U.S. Cl. ...................................... 324/307; 324/309
(58) Field of Search ................................. 324/307, 309, 324/318, 319, 322

(56) References Cited

U.S. PATENT DOCUMENTS

| | | | | |
|---|---|---|---|---|
| 4,780,674 A | * | 10/1988 | Breton et al. ................. | 324/309 |
| 4,954,779 A | * | 9/1990 | Zur .............................. | 324/306 |
| 5,539,310 A | * | 7/1996 | Basser et al. ................ | 324/307 |
| 5,671,741 A | * | 9/1997 | Lang et al. .................. | 600/415 |
| 6,265,872 B1 | * | 7/2001 | Heid ............................ | 324/307 |

OTHER PUBLICATIONS

CP Bean, RW Dablois and LB Nesbitt, J Appl Phys, 30, 1976 (1959).

J LaPage, A Bernalite, and DA Lindholm, Rev Sci Instrum, 39, 1019 (1968).

PJ Basser, J Mattiello, D LeBihan, "MR Diffusion Tensor Spectroscopy and Imaging", Biophysical Journal, 66:259–267 (1994).

C Pierpaoli, P Jezzard, PJ Basser, A Barnett, G Di Chiro, "Diffusion Tensor MR Imaging in the Human Brain:", Radiology 201:637–648 (1996).

NG Papadakis, D Ng, C Haung, LD Hall, TA Carpenter, "A comparative study of acquisition schemes for diffusion tensor imaging using MRI", Journal of Magnetic Resonance, 137:67–82 (1999).

DK Jones, MA Horsfield, A Simmons, "Optimal Strategies for Measuring Diffusion in Anisotropic Systems by Magnetic Resonance Imaging", Magnetic Resonance in Medicine, 42:515–525 (1999).

(List continued on next page.)

*Primary Examiner*—Bril B. Shrivastav
(74) *Attorney, Agent, or Firm*—Paul Vincent

(57) ABSTRACT

A method for eddy current compensated diffusion imaging using magnetic resonance is used to obtain a spin echo signal in a readout time window by excitation of a nuclear resonance signal using a first radio-frequency pulse and by refocusing that signal using at least one second radio-frequency pulse and a third radio-frequency pulse. Gradients fields are applied in a gradient field direction field having a strength and being activated by gradient pulses between each of said radio-frequency pulses and prior to said readout window, said gradient pulses having a polarity which is alternated between successive gradient pulses, with a totality of said gradient pulses having a gradient time integral of zero between a time of said excitation and the center of $k_x$ or k-space. At least two of said gradient pulses have differing gradient time integrals. The gradient direction is then changed and the previous steps repeated to evenly distribute gradient direction vectors over a sphere. An eddy current compensated and optimized imaging sequence is thereby produced which achieves improved imaging through optimization of signal to noise ratios of the detected signal while avoiding distortions in imaging due to magnetic fields associated with eddy currents.

18 Claims, 6 Drawing Sheets

OTHER PUBLICATIONS

Stejskal et al., "Spin Diffusion Measurements: Spin Echoes in the Presence of a Time–Dependent Field Gradient", Journal of Chemical Physics, 42(1): 288–292 (1965).

Y. Bito, S. Hirata, E. Yamamoto, "Optimal gradient factors for ADC measurements", Proceedings of the $3^{rd}$ Annual meeting of ISMRM, Nice, France, p. 913, (1995).

A.L. Alexander, J.S. Tsuruda, D.L. Parker, "Elimination of Eddy Current Artifacts in Diffusion–Weighted Echo–Planar Images: The Use of Bipolar Gradients", Magnetic Resonance in Medicine, 38:1016–1021 (1997).

O. Heid, "Eddy Current–Nulled Diffusion Weighting", Proc. Int. Soc. Mag. Reson. Med., 8:799 (2000).

* cited by examiner

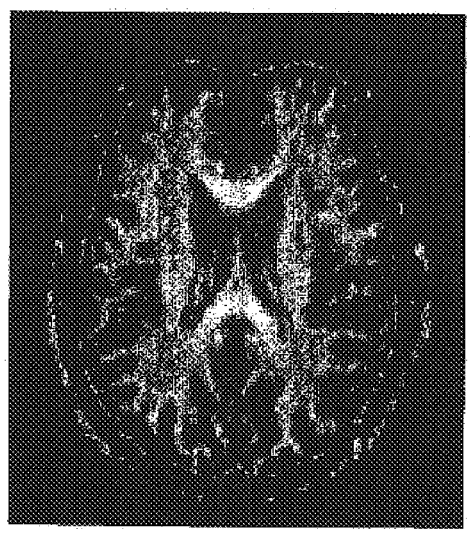 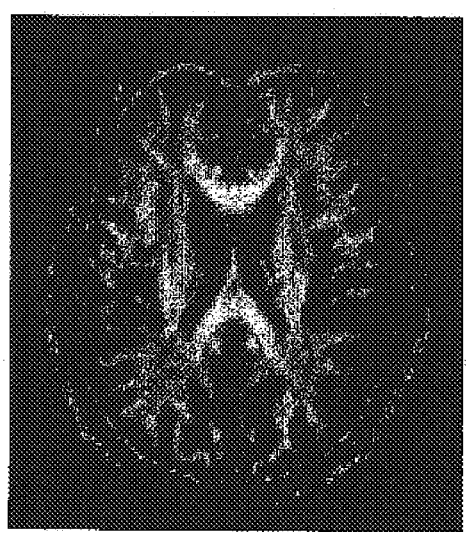
Fig. 4a                    Fig. 4b

MAGNETIC RESONANCE DIFFUSION IMAGING WITH EDDY-CURRENT COMPENSATION

BACKGROUND OF THE INVENTION

Diffusion tensor imaging (DTI) has a number of important applications including characterizing the effect of ischemic attacks and predicting the connectivity of the brain. Despite their clinical significance, diffusion images can suffer severe distortion due to the rapid switching of magnetic field gradients. This switching induces eddy currents in conductive materials (such as Faraday screens, RF coils, main magnet windings, and shim coils) within the field, which in turn generate induced magnetic fields that decay over time. The decay of these magnetic fields can be described as a series of exponentials with relatively long time constants (typically tens or hundreds of milliseconds)[1,2]. The induced time varying fields contain two components: a field gradient opposing the applied gradient, and a shift in the main magnetic field $B_0(t)$. This leads to unwanted phase dispersion of the net magnetization, which results in poor excitation of spins, imperfect rephasing of echoes, loss of signal and image distortion. Depending upon the direction of the eddy current relative to the imaging plane, the image can be sheared, scaled or translated in the phase encoding direction. In diffusion tensor imaging, the diffusion gradient amplitudes are often significantly larger than the imaging gradients and are often applied in several directions simultaneously. This leads to a complicated combination of shearing, scaling and translation.

In view of the above mentioned aspects of prior art it is the underlying purpose of the present invention to introduce an eddy current compensated and optimized imaging sequence which achieves improved imaging through optimization of signal to noise ratios of the detected signal while avoiding distortions in imaging due to magnetic fields associated with eddy currents.

SUMMARY OF THE INVENTION

The object of the invention is achieved with a method of eddy current compensated diffusion imaging using magnetic resonance in which a spin echo signal is obtained in a readout time window by excitation of a nuclear resonance signal using a first radio-frequency pulse. The first radio-frequency pulse is refocused using at least one second radio-frequency pulse and one third radio-frequency pulse. Gradient fields are applied, those fields having a direction and strength and being activated by means of gradient pulses, the gradient pulses located between each of the radio-frequency pulses and prior to the readout window. To generate an echo at the correct position within the readout time window, the totality of the gradient pulses has a gradient time integral between a time of said excitation and the center of $k_x$ (or center of k-space if there is a number of echoes for one excitation pulse) which is equal to zero. In this sequence, gradient pulses are applied with two-fold purpose:

1) Generation of spin echo image: These gradients are referred to as imaging gradients, applied for frequency encoding, at least one direction of phase encoding, and slice encoding. A number of echoes can be generated for one excitation RF pulse by using alternating frequency encoding gradients for each echo (echo-planar readout).

2) Generation of diffusion weighting: The diffusion gradient pulses have a polarity, which is alternated between successive gradient pulses. Although the totality of the gradient pulses having a gradient time integral between a time of said excitation and of the center of $k_x$ (or k-space if there is a number of echoes for one excitation pulse) is equal to zero, at least two of the gradient pulses have differing gradient time integrals in order to reduce problems due to stimulated echoes. In a subsequent method step in accordance with the invention, the gradient direction is changed and the previous steps are repeated to evenly distribute gradient direction vectors over a sphere.

The use of diffusion gradient pulses having alternate polarities in the manner described above and having a total gradient time integral of zero with at least two of the gradient pulses having differing gradient time integrals, provides a diffusion imaging method which is effective in avoiding distortions in the image due to eddy current production. By combining these features with a systematically changed gradient direction such that the gradient vectors are evenly distributed over a sphere, imaging distortions due to directional differences in the diffusion tensor are avoided.

In a preferred embodiment of the invention, time locations of the radio-frequency pulses, the time to the center of kx or k-space as well as the time of gradient pulses are adjusted to maximize diffusion parameter signal to noise ratio and to minimize eddy current field distortion at the center of $k_x$ or k-space. The signal to noise ratio tends to decrease with increasing time duration of the pulse sequence. However, later readout time windows are further removed from possible eddy current distortions caused by the switching of the gradient fields. Therefore, a compromise must be made between th e need for good signal to noise ratio while avoiding eddy current field distortions. By balancing these two conflicting requirements, an optimized pulse sequence can be obtained.

In a preferred improvement in this latter embodiment, the time locations are iteratively and systematically varied to obtain a relative maximum in the signal to noise ratio and a relative minimum in eddy current field distortions. This variation takes advantage of a two-dimensional correlation between the time dependences of the signal to noise ratio and eddy current distortion to optimize the pulse sequence. By iteratively and systematically varying the time locations of the radio frequency pulses and the gradient fields relative to the readout time window an optimized sequence can be obtained.

In a preferred embodiment, the time locations are analyzed as a function of echo times, defined by th e locations of the RF refocusing pulses. This embodiment has the advantage of taking into consideration the relationship between the echo time and the transverse relaxation time and their effects on the signal to noise ratio. The RF refocusing pulse time in spin echo sequences defines the echo time and therefore affects the overall time duration of the pulse sequence and the associated signal to noise ratio at readout.

In a further improvement, the time locations are analyzed as a function of gradient field durations. The gradient field durations affect the integral of the diffusion gradient field and therefore the overall strength of diffusion related signals while also directly influencing the overall time duration of the diffusion sequence and therefore the associated signal to noise ratios at readout.

In a further improvement, the time locations are analyzed as a function of an eddy current decay time. In this manner, an additional parameter influencing the time dependence of eddy currents is taken into consideration.

In a preferred embodiment of the invention, time locations are analyzed as a function of a number of measurements. The overall number of measurements taken to determine the diffusion tensor influences the signal to noise ratio at readout. Consideration of the number of measurements in defining the time locations for the gradient and RF excitation pulses permits an improved iterative optimization of these parameters.

In an associated improvement, the time locations are analyzed as a function of a gradient time integral. As previously mentioned, the overall time duration of the sequence as well as the strength of the gradient fields leading to observable diffusion effects directly depend on the gradient time interval. Taking this integral into consideration in determining the details of the pulse sequence therefore leads to improved signal to noise ratios and associated image quality.

In an improved method, the time locations are analyzed as a function of diffusivity. Clearly the overall image quality depends not only on the time duration of the pulse sequence and the other parameters mentioned above, but also on the diffusivity of the spin system being measured, since the sensitivity with which the diffusion tensor can be determined depends not only on the time relationships of the various pulses in the diffusion imaging pulse sequence but also on the measurement result itself. Therefore, this feature should be taken into consideration if an optimized pulse sequence is to be obtained.

In an improvement, (as mentioned above in relation to echo times) the time locations are analyzed as a function of transverse relaxation time. Since the signal to noise ratio depends on the transverse relaxation time, longer transverse relaxation times permit pulse sequences of longer duration. By taking into consideration these effects, the duration of the pulse sequence can be optimized for the spin system under study.

In a particularly preferred embodiment of the invention, the time locations of the various gradients and RF excitation pulse are analyzed and optimized using the following formula:

$$\sigma_D = \sigma \sqrt{e^{\frac{2TE}{T_2}} \left( \frac{N_H + (N - N_H) \cdot e^{2b_{max}D}}{S_o^2 b_{max}^2 N_H (N - N_H)} \right)}$$

wherein $\sigma_D$ is an error in a diffusion measurement, $b_{max}$ a gradient time integral of a diffusion gradient, $N$ a given number of measurements, $N_H$ a subset of measurements acquired at $b_{max}$, $S_o$ an initial signal amplitude of moving spins in a diffusion weighted sequence, $D$ a diffusivity, $TE$ an echo time, $T_2$ a transverse relaxation rate, and $\sigma^2$ a variance of a noise portion of a measured signal. By taking into account these parameters and their mutual functional relationship in the above mentioned formula, the image quality can be more precisely optimized.

In a preferred variation of this latter embodiment, the following formula is also used to determine the optimum time locations:

$$H(t) \approx e^{-\lambda_i(tD1+tD2+tD3+tD4+2t180+ts)} - e^{-\lambda_i(tD2+tD3+tD4+2t180+ts)} -$$
$$e^{-\lambda_i(tD2+tD3+tD4+t180+ts)}$$
$$+2e^{-\lambda_i(tD3+tD4+t180+ts)} - e^{-\lambda_i(tD4+t180+ts)} - e^{-\lambda_i(tD4+ts)} + e^{-\lambda_i(ts)}$$

wherein $H(t)$ is a magnetic field due to eddy currents, $\lambda_i$ a decay rate of eddy currents triggered by a rise and fall of gradients, i an index of a number of different decay rates generated for each gradient switching point, $t_{Dj}$ a duration of a jth diffusion gradient, $t_{180}$ a time of an RF refocusing pulse, and $t_s$ a delay before a center of an echo or a center of K-space.

By using the above formula, the time dependence of the distorting magnetic fields associated with eddy currents can be taken into consideration to time the gradients and the RF excitation signals as well as the readout time to avoid regions in which eddy currents are likely to upset or disturb the results of the diffusion imaging measurement. Both these parameters as well as their functional relationship are taken into consideration.

In a preferred embodiment of the invention, the gradient field strengths are adjusted and selected to maximize diffusion imaging sensitivity. This improvement of the invention takes into consideration the dependence of the result of the diffusion imaging measurement on the diffusivity of the medium being measured which, in turn, defines an optimum gradient field strength which takes into consideration the intrinsic diffusion performance of the spin system under study.

In a preferred embodiment of the invention, three diffusion gradients in three orthogonal spatial directions are simultaneously applied and the relative field strengths of these gradients are changed between successive iterations of the method, although the sum total vector gradient field strength is kept constant to maintain a maximum b-value. This particular measure has the advantage of using a minimum number of gradients to generate a gradient vector in an arbitrary spatial direction thereby allowing for a uniform filling of the directional vectors of the gradients on a sphere such that the results of the diffusion imaging measurement do not depend on directional anisotropies in the diffusion tensor.

In a preferred embodiment of this latter method variant, the three gradients are a frequency gradient, a phase gradient and a slice selection gradient. This embodiment has the advantage of utilizing normally existing gradients to effect an arbitrary gradient vector direction.

In a preferred embodiment of the method, a slice selection gradient is applied during a time duration of said radio frequency pulses. This measure has the advantage of more precisely defining an imaging slice by excitation of spins in that slice through adjustment of the frequency of the excitation pulse in dependence on the overall field strength within the slice.

In a preferred embodiment of the invention, a diffusion gradient pulse of a first polarity is activated between the first radio frequency pulse and the second radio pulse, with two gradient pulses of different polarity being subsequently activated between a second radio frequency pulse and a third radio frequency pulse, wherein the additional two gradient pulses begin with a polarity with its opposite to the first polarity of the first gradient pulse. Moreover, another gradient pulse is activated between a third radio frequency pulse and the readout window. This embodiment provides a simple pulse sequence, which satisfies the conditions for minimizing eddy current generation and the associated distorting magnetic fields at signal readout. The total gradient integral of the four diffusion gradient pulses must be equal to zero by the readout window, and preferably two individual time integrals must be different to avoid stimulated echoes.

In a preferred embodiment on the invention, activating a phase encoding gradient prior to the readout time window and activating a readout gradient during that readout time window spatially encode a spin echo signal. For each excitation pulse, either one readout gradient to obtain one echo, or a train of alternating polarity readout gradients (echo-planar readout) for a chain of echoes can be applied. In the case of an echo-planar readout, phase encoding for each echo occurs between each echo. This measure takes advantage of standard techniques in spin echo imaging to facilitate straightforward and economical data acquisition.

Further advantages of the invention can be derived from the associated description of the preferred embodiment in connection with the drawings. The features disclosed in the subsequent preferred embodiment, in the figures and in the attached claims can be important to the invention either singly or collectively in any arbitrary combination. The inventive embodiments disclosed are not considered to be exhaustive enumeration of all possible inventive configurations, rather have exemplary character for illustrating the invention. The invention is more closely described below in connection with the drawings.

BRIEF DESCRIPTION OF THE DRAWING

FIG. 4a represents an FA map of an internal capsule using a 6-directional diffusion weighted, non-optimized sequence;

FIG. 4b represents an FA map comparable to that of FIG. 4a however using an optimized Jones DTI sequence;

DESCRIPTION OF THE PREFERRED EMBODIMENT

To fully characterize diffusion in an anisotropic media, the diffusion tensor D needs to be obtained with maximized accuracy.

$$D = \begin{bmatrix} D_{xx} & D_{xy} & D_{xz} \\ D_{yx} & D_{yy} & D_{yz} \\ D_{zx} & D_{zy} & D_{zz} \end{bmatrix} \quad (1)$$

Each element of the matrix refers to the diffusion flux for a concentration gradient in a given direction, where xx, yy, and zz refer to the x, y, and z-axes and the off-diagonal elements refer to the cross-terms between different directions.

The reduction in signal from the increased dephasing of moving spins in a diffusion weighted sequence is proportional to the gradient time integral of the diffusion gradient, b.

$$S = S_o e^{\frac{TE}{T_2}} e^{-(b_{xx}D_{xx}+b_{yy}D_{yy}+b_{zz}D_{zz}+2b_{xy}D_{xy}+2b_{xz}D_{xz}+2b_{xz}D_{xz})} \quad (2)$$

$$b_{xx} = \gamma^2 \int_0^{TE} F_x(t') \cdot F_x(t') \cdot dt' \text{ where } F_x(t) = \int_0^t G_x(t)dt \quad (3)$$

Traditional diffusion experiments involve taking a series of measurements; a range of different b values is applied at each of 6 or 12 directions[3,4,5].

Figure 1:
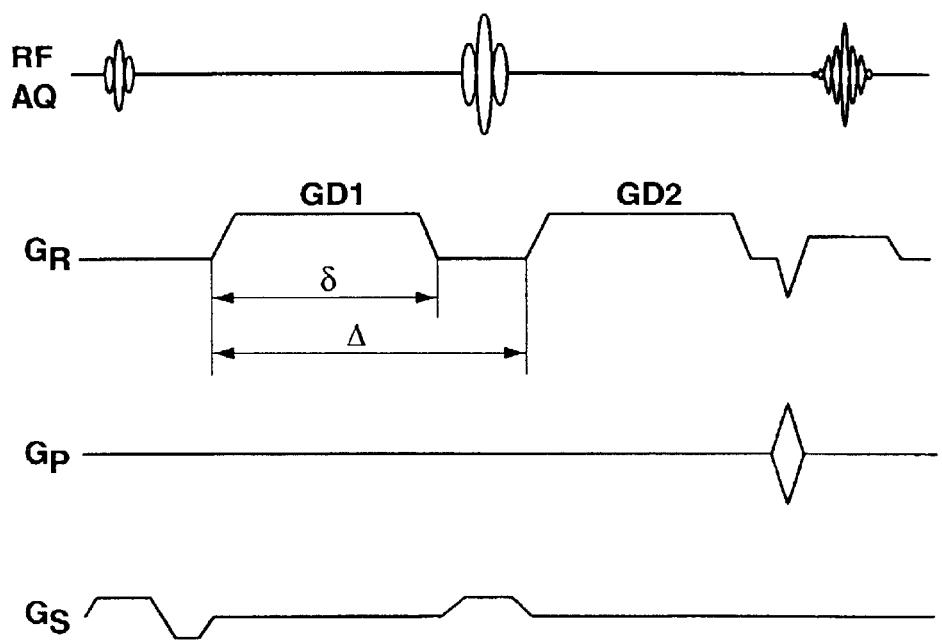
FIG. 1 shows a schematic pulse sequence corresponding to the conventional Stejskal-Tanner diffusion sequence.

An optimized approach to anisotropic diffusion measurement was developed by Jones et al.[6], based on the Steskjal-Tanner[7] diffusion sequence (see FIG. 1). It seeks to minimize the error in the diffusion tensor and remove directional bias. Bito et al.[8] determined that the error in the diffusion measurement ($\sigma_D$) is minimized through employing two sets of diffusion measurement—one without diffusion gradients, one using a constant b value ($b_{MAX}$). The error can be expressed as:

$$\sigma_D = \sigma \sqrt{e^{\frac{2TE}{T_2}} \left( \frac{N_H + (N-N_H) \cdot e^{2b_{max}D}}{S_o^2 b_{max}^2 N_H (N-N_H)} \right)} \quad (4)$$

where for a given number of measurements (N), a sub-set ($N_H$) has been acquired at the constant b value. This equation allows for the fact that the signal ($S_0$) decays relative to the echo time (TE), and that the error is also dependent upon the nature of the tissue under investigation, particularly the diffusivity (D) and the transverse relaxation rate ($T_2$).

To exclude the directional bias that exists in traditional diffusion methods, Jones' method applies three diffusion gradients (x, y, and z) concurrently, such that the diffusion gradient vectors are evenly distributed over a sphere. This ensures that the angles between the applied gradient directions are evenly spaced. The difference between the traditional approach and the Jones' method can be seen in FIG. 4, where the fractional anisotropy maps show increased definition of the white matter tracts where the diffusion sequence was optimized based upon minimum error and removal of directional bias. FIGS. 4a and 4b show representative FA maps indicating increased definition (increased accuracy in the measure of anisotropy) of the white manner tracts within the internal capsule measured with the optimized Jones DTI sequence. FIG. 4a was acquired with a 6-direction diffusion weighted sequence (5 b-values, total of 31 images per slice) with 0.89×0.89×5 mm resolution, a TR/TE values of 5,000/106 ms, $b_{max}$ of 1100 and an AQ time of 2.32 minutes (19 slices). FIG. 4b is a result of a 30 b-value optimized DTI sequence having 0.89×0.89×5 mm definition, TR/TE of 5,000/106 ms, $b_{max}$ of 1100 and an AQ time of 2.27 minutes (19 slices).

In addition to the cumulative effect of the errors in the signal measurement, there are also significant distortions through the generation of eddy currents induced within the conductive materials. This is particularly a problem in the optimized Jones' method leads to a complicated combination of distortion effects since three gradient directions are applied concurrently. (See FIGS. 6(c)–(f).)

Positive and negative eddy currents are induced by the rise and fall of a trapezoidal gradient waveform. For a relatively short gradient waveform the eddy currents from the rise and fall will tend to cancel.[9] However, in the case of relatively long diffusion gradients in the Stejskal-Tanner[7] scheme, the eddy currents generated will not cancel efficiently, and the residual eddy current will be proportional to the gradient amplitude and duration. An eddy current corrected diffusion scheme was developed by Heid,[10,11] that employs shorter diffusion gradients of oscillating polarity, incorporated into a scheme with an odd number of refocusing pulses. (see FIG. 2).

The following multi-exponential model can approximate the eddy current decay:

$$H(t) = \Sigma k_i e^{-\lambda_i t} \qquad (5)$$

Here, $\lambda_i$ is the decay rate of the eddy currents triggered by the rise and fall of the gradients, where a number of different decay rates, i, will be generated for each gradient switching point. Eddy current image distortion is not apparent if there has been sufficient decay by the time of the readout gradient, T.

Figure 2:
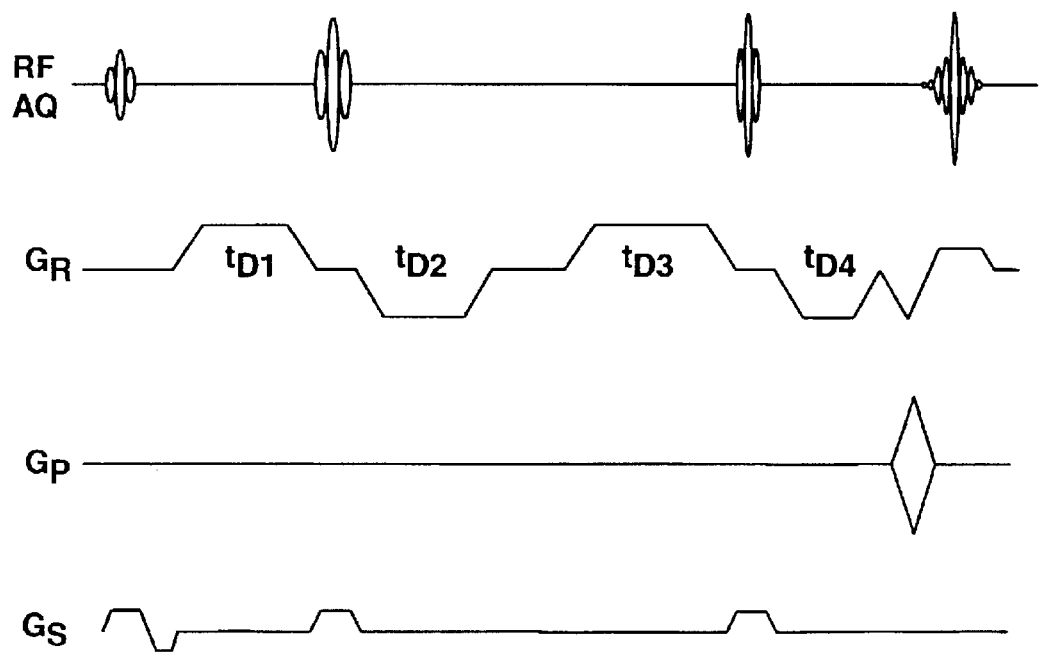
FIG. 2 schematically indicates an eddy current correction diffusion scheme first proposed by Heid.

For the sequence of diffusion pulses shown in FIG. 2, the following equation can be derived:

$$H(t) \approx e^{-\lambda_i(tD1+tD2+tD3+tD4+2t180+t_s)} - e^{-\lambda_i(tD2+tD3+tD4+2t180+t_s)} -$$
$$e^{-\lambda_i(tD2+tD3+tD4+t180+t_s)}$$

$$+2e^{-\lambda_i(tD3+tD4+t180+t_s)} - e^{-\lambda_i(tD4+t180+t_s)} - e^{-\lambda_i(tD4+t_s)} + e^{-\lambda_i(t_s)} \qquad (6)$$

where $t_{Dj}$ is the duration of the jth diffusion gradient, $t_{180}$ is the time of the RF refocusing pulse, and $t_s$ is the delay before the center of the echo, or the center of k-space when an EPI readout method is used. The sign alternates since the eddy currents induced by one pulse is compensated by those induced by a subsequent pulse of inverted polarity. The most significant image distortions occur where $\lambda_i T \sim 1$.

Figure 5A:
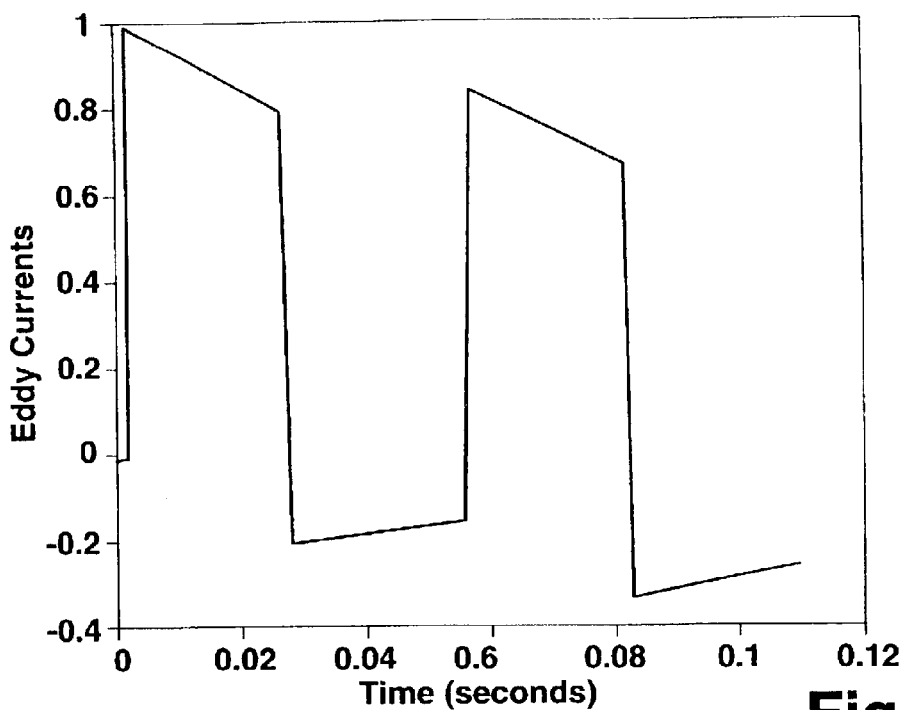
FIG. 5a shows current decay due to diffusion gradients associated with the Jones sequence.
Figure 5B:
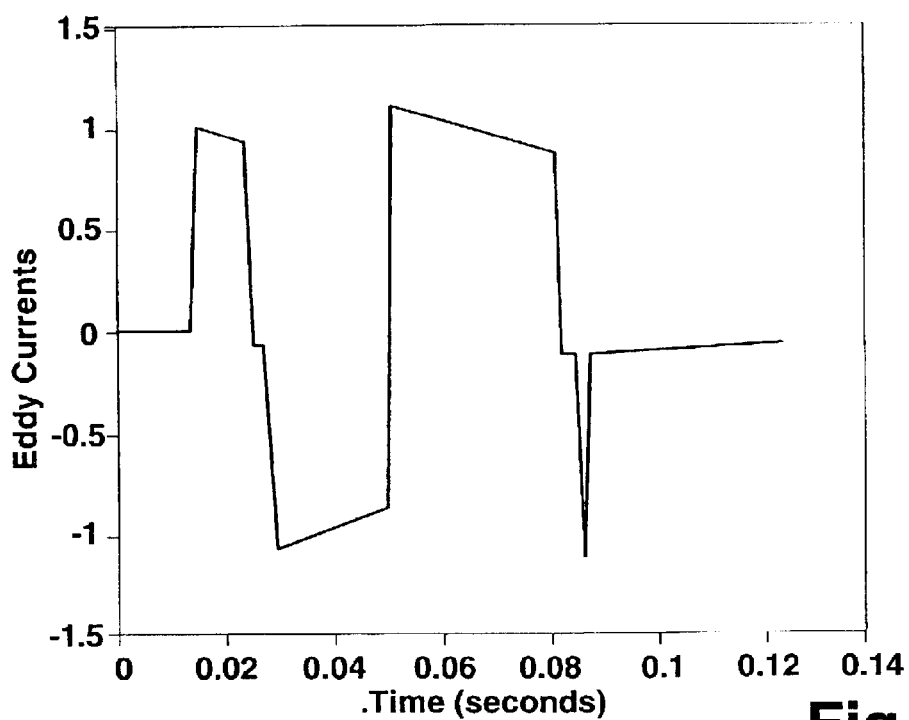
FIG. 5b shows eddy current decay due to diffusion gradients associated with the Heid sequence.
Figure 6A:
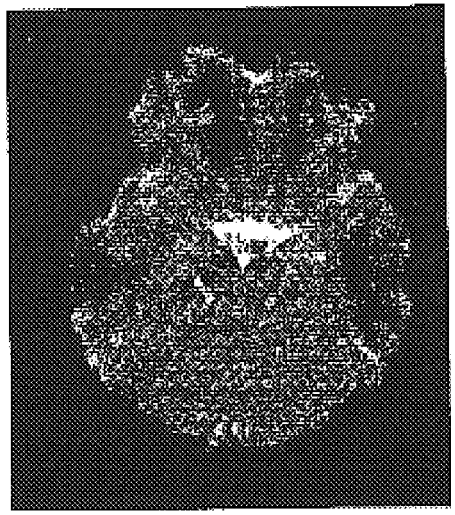
FIG. 6a shows an image without diffusion weighting.
Figure 6B:
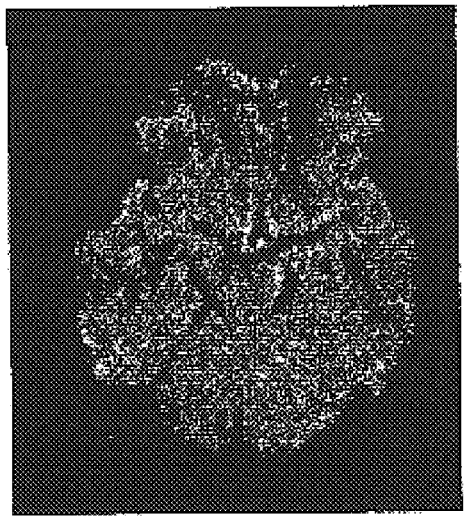
FIG. 6b shows a diffusion weighted image incorporating an eddy current correction scheme.
Figure 6C:
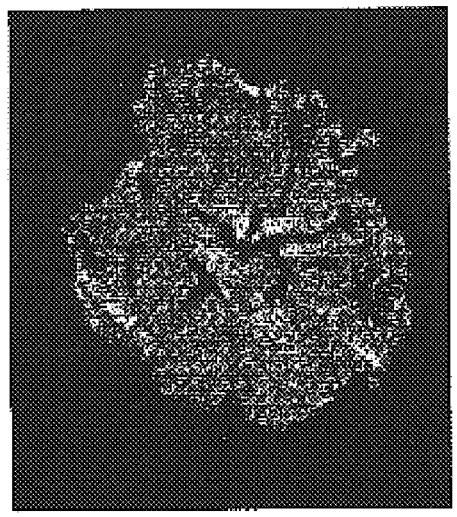
FIG. 6c shows a image according to the Jones scheme without eddy current correction measured in a first gradient direction and acquired with the same b value as FIG. 6b.
Figure 6D:
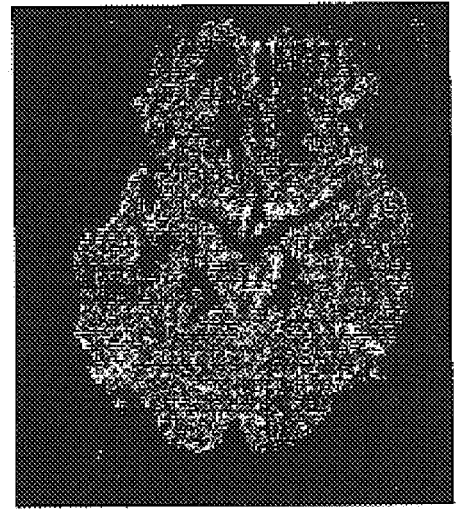
FIG. 6d shows an image using the Jones correction scheme without eddy current correction in a second gradient direction and acquired with the same b value as in FIG. 6b.
Figures 6E, 6F:
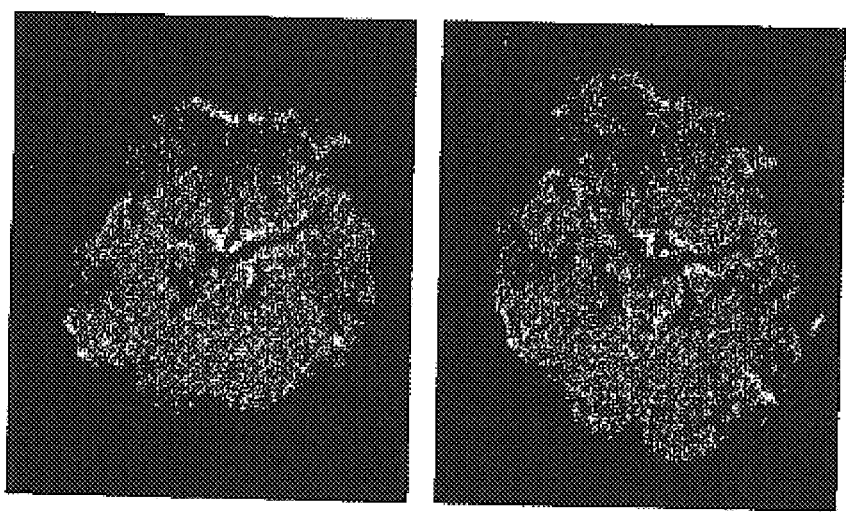
FIG. 6e shows an image from the Jones scheme without eddy current correction acquired with the same b value as FIG. 6b, in a third gradient direction.
FIG. 6f shows an image from the Jones scheme without eddy current correction acquired with the same b value as FIG. 6, in a fourth gradient direction.

Equation 6 is shown for a given parameter set in FIG. 5(b), for a $\lambda_i$ value of 1/T, where $$T = t_{D1} + t_{D2} + t_{D3} + t_{D4} + 2t_{180} + t_s \qquad (7)$$

As can be seen by comparing (a) and (b) in FIG. 5, the bipolar approach taken in Heid's method results in minimal eddy currents at the readout time. For certain parameter sets, the eddy currents are nulled. Raw diffusion weighted images acquired using Heid's eddy current optimized scheme are compared with those acquired using Jones' method in FIG. 6.

For the series of alternating gradients in combination with refocusing RF pulses in FIG. 2 to give diffusion weighting, there must be complete rephasing of the stationery spins. This is true, provided that the total area under the diffusion gradients is matched. That is, for a given gradient amplitude:

$$t_{D1} + t_{D2} - t_{D3} - t_{D4} = 0 \qquad (8)$$

The phase shift experienced by moving spins is dependent upon their position in the field gradient, which changes within and between each diffusion gradient pulse. At the end of the diffusion sequence, moving spins possess a phase shift that is greater than zero and proportional to the extent of diffusion.

Due to imperfect 180 degree pulses, the application of three RF pulses (as in FIG. 2) can generate a stimulated echo. This leads to further complications in diffusion measurements, but this is avoided if at least two of the diffusion pulses have different gradient time integrals.[10,11]

Ignoring the contribution from the ramp time, the four gradient lobes in FIG. 2 generate a b factor of the following:

$$b = \gamma^2 G^2 \left[ \begin{array}{c} \frac{t_{D_1}^2}{3} + \frac{t_{D_2}^2}{3} + \frac{t_{D_3}^2}{3} + \frac{t_{D_4}^2}{3} + \\ t_{180}(2t_{D_1}^2 + t_{D_2}^2 + t_{D_3}^2 + 2t_{D_1}t_{D_2} - 2t_{D_1}t_{D_3} - 2t_{D_2}t_{D_3}) \end{array} \right] \qquad (9)$$

Figure 3:
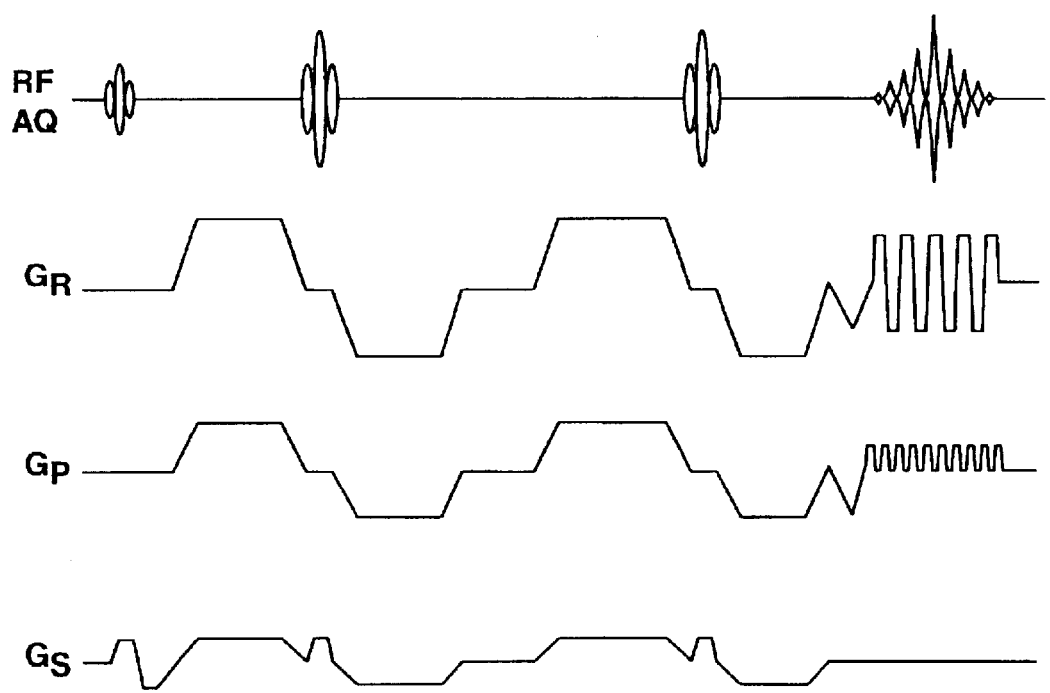
FIG. 3 illustrates the ECCO DTI sequence in accordance with the instant invention (incorporating an echo-planar readout)

The Jones and Heid approaches seek to optimize the accuracy of the diffusion measurement through addressing two different concerns. The first method seeks to reduce the cumulative error in the diffusion tensor given an inherent error in the signal of a given voxel, while the latter seeks to reduce the inherent error by reducing the image distortion generated by eddy currents from the diffusion gradients. In this patent, these two approaches were combined to generate an eddy current corrected and optimized sequence for measuring anisotropic diffusion (ECCO DTI, see FIG. 3).

Combining the two approaches leads to a series of equations that describe the restrictions on the eddy current corrected optimized sequence. Equations (4) and (6) are in fact contradictory, where eddy current decay cannot be minimized completely without unacceptable loss of signal from $T_2$ decay, and increased error in the diffusion measurement. An iterative approach to manipulating parameters to satisfy the above equations was applied, and the gradient orientations were determined for each value of $N_H$ as described above.

REFERENCES

1. C P Bean, R W Deblois and L B Nesbitt, J Appl Phys, 30, 1976 (1959)
2. J LaPage, A Bernalite, and D A Undholm, *Rev Sci Instrum*, 39 1019 (1968)
3. P J Basser, J Mattiello, D LeBihan, "MR Diffusion Tensor Spectroscopy and Imaging", *Biophysical Journal*, 66:259–267 (1994).
4. C Plerpaoll, P Jezzard, P J Basser, A Barnett, G Di Chiro, "Diffusion Tensor MR Imaging in the Human Brain:", *Radiology*, 201: 637–648 (1996).
5. N G Papadakis, D Ng, C Haung, L D Hall, T A Carpenter, "A comparative study of acquisition schemes for diffusion tensor Imaging using MRI", *Journal of Magnetic Resonance*, 137:67–82 (1999).
6. D K Jones, M A Horsfield, A Simmons, "Optimal Strategies for Measuring Diffusion in Anisotropic Systems by Magnetic Resonance Imaging", *Magnetic Resonance in Medicine*, 42:515–525 (1999).
7. Stejskal et al., "Spin Diffusion Measurements: Spin Echoes in the Presence of a Time-Dependent Field Gradient", *Journal of Chemical Physics*, 42(1): 288–292 (1965).
8. Y. Bito, S. Hirata, E. Yamamoto, "Optimal gradient factors for ADC measurements", *Proceedings of the 3rd Annual meeting of ISMRM*, Nice, France, p913, (1995).
9. A. L. Alexander, J. S. Tsuruda, D. L. Parker, "Elimination of Eddy Current Artifacts in Diffusion-Weighted Echo-Planar Images: The Use of Bipolar Gradients", *Magnetic Resonance in Medicine*, 38:1016–1021 (1997).
10. O. Heid, "Eddy Current-Nulled Diffusion Weighting", *Proc. Int. Soc. Mag. Reson. Med.*, 8:799 (2000).
11. O. Heid, "Diffusion detection by means of magnetic resonance", U.S. Pat. No. 6,265,872, Jul. 24 (2001).

What is claimed is:

1. A method for eddy current compensated diffusion imaging using magnetic resonance, the method comprising the steps of:

a) obtaining a spin echo signal in a readout time window by excitation of a nuclear resonance signal using a first radio-frequency pulse and by refocusing that signal using at least one second radio-frequency pulse and a third radio-frequency pulse;

b) applying imaging gradient fields prior to a first restoring pulse to the spatially encode image in slice, read and phase directions;

c) applying additional, after said first refocusing pulse, gradient fields of a specfic direction and amplitude through activation of gradient pulses between each of said radio-frequency pulses and prior to said readout window, said gradient pulses having a polarity which is alternated between successive gradient pulses, a totality of said gradient pulses having a gradient time integral of zero between a time of said excitation and the center of $k_x$ or k-space, with at least two of said gradient pulses having differing gradient time integrals;

d) changing said gradient direction; and e) repeating steps a) to c) to evenly distribute the additional gradient direction vectors over a sphere.

2. The method of claim 1, further comprising adjustment of time locations of said radio-frequency pulses, said readout time window and said gradient fields to maximize a diffusion parameter related signal to noise ratio and to minimize eddy current field distortion at the center of $k_x$ or k-space.

3. The method of claim 2, wherein said time locations are iteratively and systematically varied to obtain a relative maximum in said signal to noise ratio and a relative minimum in said eddy current field distortion.

4. The method of claim 3, wherein said time locations are analyzed as a function of echo times.

5. The method of claim 4, wherein said time locations are analyzed as a function of gradient field durations dependent upon echo times.

6. The method of claim 5, wherein said time locations are analyzed as a function of an eddy current decay time.

7. The method of claim 3, wherein said time locations are analyzed as a function of a number of measurements.

8. The method of claim 3, wherein said time locations are analyzed as a function of a gradient time integral.

9. The method of claim 3, wherein said time locations are analyzed as a function of the diffusivity of the sample under measurement.

10. The method of claim 3, wherein said time locations are analyzed as a function of transverse relaxation time.

11. The method of claim 3, wherein said time locations are analyzed using the following formula:

$$\sigma_D = \sigma \sqrt{e^{\frac{2TE}{T_2}} \left( \frac{N_H + (N - N_H) \cdot e^{2b_{max}D}}{S_0^2 b_{max}^2 N_H (N - N_H)} \right)}$$

wherein $\sigma_D$ is an error in a diffusion measurement, $b_{max}$ a gradient time integral of a diffusion gradient, N a given number of measurements, $N_H$ a subset of measurements acquired at $b_{max}$, $S_0$ an initial signal amplitude of moving spins in a diffusion weighted sequence, D a diffusivity, TE an echo time, $T_2$ a transverse relaxation rate, and $\sigma^2$ a variance of a noise portion of a measured signal.

12. The method of claim 3, wherein said time locations are analyzed using the following formula $$H(t) \approx e^{-\lambda_i(tD1+tD2+tD3+tD4+2t180+ts)} - e^{-\lambda_i(tD2+tD3+tD4+2t180+ts)} - e^{-\lambda_i(tD2+tD3+tD4+t180+ts)}$$

$$+ 2e^{-\lambda_i(tD3+tD4+t180+ts)} - e^{-\lambda_i(tD4+t180+ts)} - e^{-\lambda_i(tD4+ts)} + e^{-\lambda_i(ts)}$$

wherein H(t) is a magnetic field due to eddy currents, $\lambda_i$ a decay rate of eddy currents triggered by a rise and fall of gradients, i an index of a number of different decay rates generated for each gradient switching point, $t_{Dj}$ a duration of a jth diffusion gradient, $t_{180}$ a time of an RF refocusing pulse, and $t_s$ a delay before a center of an echo or a center of K-space.

13. The method of claim 1, further comprising selecting said gradient field strengths in steps c) and e) to maximize diffusion imaging sensitivity.

14. The method of claim 1, wherein steps c), d), and e) comprise simultaneous application of three gradients in three orthogonal spatial directions and changing relative field strengths of said three gradients between successive iterations of step e).

15. The method of claim 14, wherein said three gradients are expressed in Cartesian or radial coordinates.

16. The method of claim 1, wherein step c) comprises the steps of:

c1) activating a gradient pulse of a first polarity between said first radio-frequency pulse and said second radio-frequency pulse;

c2) activating two gradient pulses of differing polarity between said second radio-frequency pulse and said third radio-frequency pulse, beginning with a polarity which is opposite to said first polarity; and c3) activating another gradient pulse between said third radio-frequency pulse and said readout window.

17. The method of claim 1, further comprising application of said slice selection gradient during a time duration of said radio-frequency pulses.

18. The method of claim 1, wherein step b) comprises the steps of:

b1) spatially encoding a spin echo signal by activating a phase-encoding gradient prior to said readout; and b2) activating a readout gradient during said readout time window, or:

b3) activating a series of oscillating readout gradients during said readout time window, incorporating phase encoding between each readout gradient.

* * * * *

UNITED STATES PATENT AND TRADEMARK OFFICE
CERTIFICATE OF CORRECTION

| | | |
|---|---|---|
| PATENT NO. | : 6,815,952 B1 | Page 1 of 1 |
| APPLICATION NO. | : 10/435251 | |
| DATED | : November 9, 2004 | |
| INVENTOR(S) | : Stephen Edward Rose | |

It is certified that error appears in the above-identified patent and that said Letters Patent is hereby corrected as shown below:

Col. 9, Line 4 Please amend paragraphs b) and c) of claim 1 as follows:

b) applying imaging gradient fields, prior to a first ~~restoring~~ refocusing pulse, to ~~the~~ spatially encode the image in slice, read and phase directions;

c) applying ~~additional,~~ after said first refocusing pulse, additional gradient fields of a specific direction and amplitude through activation of gradient pulses between each of said radio-frequency pulses and prior to said readout window, said gradient pulses having a polarity which is alternated between successive gradient pulses, a totality of said gradient pulses having a gradient time integral of zero between a time of said excitation and the center of $k_x$ or k-space, with at least two of said gradient pulses having differing gradient time integrals;

Signed and Sealed this

Seventh Day of April, 2009

JOHN DOLL
*Acting Director of the United States Patent and Trademark Office*